(12) United States Patent
Yang et al.

(10) Patent No.: US 7,295,463 B2
(45) Date of Patent: Nov. 13, 2007

(54) PHASE-CHANGEABLE MEMORY DEVICE AND METHOD OF MANUFACTURING THE SAME

(75) Inventors: Soo-Guil Yang, Yongin-si (KR); Hong-Sik Jeong, Sungnam-si (KR); Young-Nam Hwang, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 103 days.

(21) Appl. No.: 11/055,094

(22) Filed: Feb. 11, 2005

(65) Prior Publication Data

US 2005/0185444 A1  Aug. 25, 2005

(30) Foreign Application Priority Data

Feb. 25, 2004  (KR) .............. 10-2004-0012780

(51) Int. Cl.
*G11C 11/00* (2006.01)

(52) U.S. Cl. .............. 365/163; 365/148; 257/2; 257/4

(58) Field of Classification Search .............. 365/163
See application file for complete search history.

(56) References Cited

U.S. PATENT DOCUMENTS

| | | | |
|---|---|---|---|
| 32,332 A | 5/1861 | Young | |
| 3,018,312 A | 1/1962 | Cornish et al. | |
| 3,271,591 A | 9/1966 | Ovshinsky et al. | |
| 3,530,441 A | 9/1970 | Ovshinsky et al. | |
| 3,699,543 A | 10/1972 | Neale | |
| 4,115,872 A | 9/1978 | Bluhm | |
| 4,225,946 A | 9/1980 | Neale et al. | |
| 4,228,524 A | 10/1980 | Neale et al. | |
| 4,389,713 A | 6/1983 | Patel et al. | |
| 5,166,758 A | 11/1992 | Ovshinsky et al. | |
| 5,177,567 A | 1/1993 | Klersy et al. | |
| 5,296,716 A | 3/1994 | Ovshinsky et al. | |
| 5,341,328 A | 8/1994 | Ovshinsky et al. | |
| 5,414,271 A | 5/1995 | Ovshinsky et al. | |
| 5,536,947 A | 7/1996 | Klersy et al. | |
| 5,787,042 A | 7/1998 | Morgan | |
| 5,825,046 A | 10/1998 | Czubatyj et al. | |
| 5,883,827 A | 3/1999 | Morgan | |
| 5,933,365 A | 8/1999 | Klersy et al. | |
| 5,952,671 A | 9/1999 | Reinberg et al. | |
| 5,998,244 A | 12/1999 | Wolstenholme et al. | |
| 6,015,977 A | 1/2000 | Zahorik | |
| 6,031,287 A | 2/2000 | Harshfield | |
| 6,075,719 A | 6/2000 | Lowrey et al. | |
| 6,117,720 A | 9/2000 | Harshfield | |

(Continued)

FOREIGN PATENT DOCUMENTS

JP  2003-249626  5/2003

*Primary Examiner*—Son L. Mai
(74) *Attorney, Agent, or Firm*—Harness, Dickey & Pierce, P.L.C.

(57) ABSTRACT

A phase changeable random access memory (PRAM) and methods for manufacturing the same. An example unit cell of a non-volatile memory, such as a PRAM, includes a MOS transistor, connected to an address line and a data line, where the MOS transistor receives a voltage from the data line. The unit cell further includes a phase change material for changing phase depending on heat generated by the voltage and a top electrode, connected to a substantially ground voltage.

24 Claims, 23 Drawing Sheets

U.S. PATENT DOCUMENTS

| | | |
|---|---|---|
| 6,147,395 A | 11/2000 | Gilgen |
| 6,189,582 B1 | 2/2001 | Reinberg et al. |
| RE37,259 E | 7/2001 | Ovshinsky |
| 6,314,014 B1 | 11/2001 | Lowrey et al. |
| 6,329,666 B1 | 12/2001 | Doan et al. |
| 6,404,665 B1 | 6/2002 | Lowrey et al. |
| 6,420,725 B1 | 7/2002 | Harshfield |
| 6,448,576 B1 | 9/2002 | Davis et al. |
| 6,480,438 B1 | 11/2002 | Park |
| 6,487,113 B1 | 11/2002 | Park et al. |
| 6,511,862 B2 | 1/2003 | Hudgens et al. |
| 6,512,241 B1 | 1/2003 | Lai |
| 6,545,903 B1 | 4/2003 | Wu |
| 6,579,760 B1 | 6/2003 | Lung |
| 6,597,031 B2 | 7/2003 | Kuge |
| 6,791,859 B2 * | 9/2004 | Hush et al. ................. 365/100 |
| 7,012,273 B2 * | 3/2006 | Chen ............................ 257/4 |
| 7,037,762 B2 * | 5/2006 | Joo et al. ..................... 438/128 |
| 7,106,618 B2 * | 9/2006 | Morimoto ................... 365/148 |
| 7,115,927 B2 * | 10/2006 | Hideki et al. ............... 257/296 |
| 7,116,593 B2 * | 10/2006 | Hanzawa et al. ........... 365/203 |
| 2003/0086291 A1 | 5/2003 | Lowrey |
| 2003/0209746 A1 | 11/2003 | Horii |
| 2004/0042298 A1 * | 3/2004 | Hideki ....................... 365/202 |
| 2004/0113192 A1 * | 6/2004 | Wicker ....................... 257/298 |
| 2004/0233748 A1 * | 11/2004 | Terao et al. ................ 365/202 |
| 2005/0032269 A1 * | 2/2005 | Xu et al. .................... 438/102 |
| 2005/0117397 A1 * | 6/2005 | Morimoto ............. 365/185.21 |
| 2005/0128799 A1 * | 6/2005 | Kurotsuchi et al. ......... 365/163 |
| 2005/0237820 A1 * | 10/2005 | Takemura et al. ..... 365/189.05 |

* cited by examiner

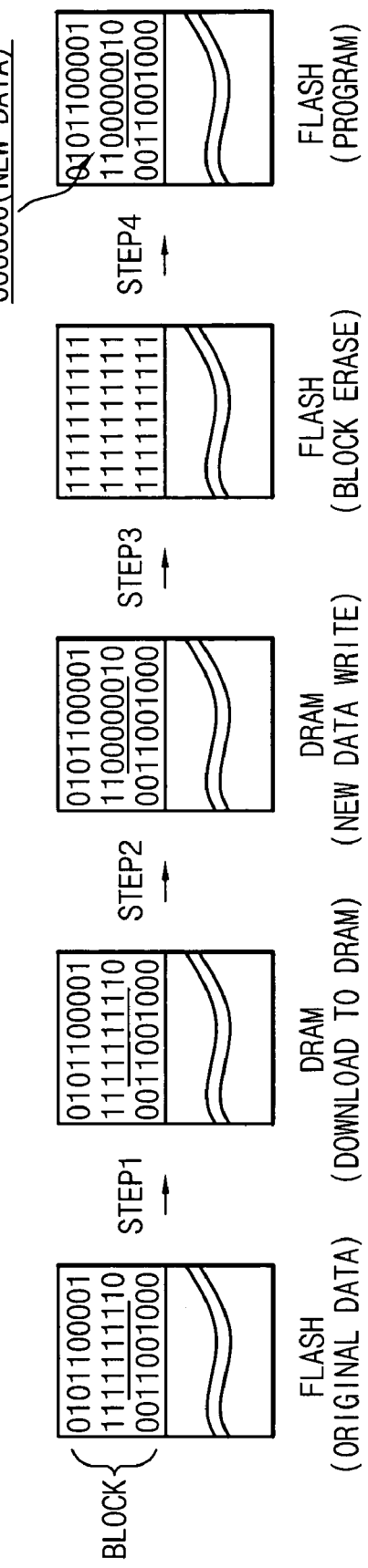

PHASE-CHANGEABLE MEMORY DEVICE AND METHOD OF MANUFACTURING THE SAME

PRIORITY STATEMENT

This application claims the benefit under 35 U.S.C. § 119(a) of Korean Patent Application No. 2004-12780, filed on Feb. 25, 2004, the contents of which are hereby incorporated by reference in their entirety.

BACKGROUND OF THE INVENTION

Memory can be divided into two types; volatile and non-volatile. Volatile memory includes static random access memory (SRAM) and dynamic random access memory (DRAM). An advantage of volatile memory is that it permits random access. A disadvantage of volatile memory is that data is lost when power is lost.

Non-volatile memory may include mask read only memory (ROM), electrically erasable programmable read only memory (EEPROM), and flash memory. Non-volatile memory does not lose data when power is lost, but generally does not permit random access and is slower than volatile memory.

There are several candidates for non-volatile random access memory that are higher speed and lower cost. These candidates include ferroelectric random access memory (FRAM), magnetic random access memory (MRAM) and phase changeable random access memory (PRAM).

A PRAM is a memory device using a phase changeable material to store a bit of data. Phase changeable materials that are used in memory devices may exhibit at least two different states. These states may be referred to as the amorphous and crystalline states. These states may be distinguished because the amorphous state generally exhibits higher resistivity than the crystalline state. Generally, the amorphous state involves a more disordered atomic structure.

A compound material of germanium (Ge), antimony or stibium (Sb) and tellurium (Te), also known as GST, may be used as the phase changeable material. An example of a conventional PRAM, including a silicon substrate 10, a bottom insulation 13, a bottom electrode 15, the phase changeable material (PCM) 17, a top electrode 19, an insulating interlayer 21, and a top interconnection 23, is shown in FIG. 1. When the top interconnection 23 is biased with a voltage, current flows from the top electrode 19 to the bottom electrode 15 through the PCM 17. The current generates joule heat from the bottom electrode 15. This heat influences the crystalline state of the PCM 17. If the heat is at a higher temperature for a shorter time period, a portion of the PCM 17 is in an amorphous state with a higher resistance. If the heat is at a lower temperature for a longer time period, a portion of the PCM 17 is in a crystalline state with a lower resistance.

There are several conventional PRAMs, some of which use a CMOS transistor as the cell access device and "push" power from a top electrode to a column line through a cell transistor. Others use a common PCM and "push" power from a top electrode to collector node of cell bipolar transistor. Still others use a common PCM and a bipolar diode for the cell access device.

SUMMARY OF THE INVENTION

Example embodiments of the present invention are directed to phase changeable random access niemory (PRAMs) and methods for manufacturing the same which are faster and/or more economical to manufacture.

Example embodiments of the present invention are directed to a unit cell of a non-volatile memory, such as a PRAM, including a MOS transistor, connected to an address line and a data line, where the MOS transistor receives a voltage from the data line. The unit cell further includes a phase change material for changing phase depending on heat generated by the voltage and a top electrode, connected to a substantially ground voltage.

The unit cell may also include a bottom electrode and one or more insulating layers.

Example embodiments of the present invention are also directed to a method of programming a unit cell of a non-volatile memory including turning on a MOS transistor of the unit cell, supplying input power from a data line, through the MOS transistor and a bottom electrode, supplying plate power to a top electrode, generating heat from the input power, and changing a state of a portion of the phase change material corresponding to the unit cell, based on the heat.

Example embodiments of the present invention are also directed to a method of reading a unit cell of a non-volatile memory including turning on a MOS transistor of the unit cell, supplying plate power to a top electrode, supplying input power from a data line, through the MOS transistor, a bottom electrode, and a phase change material, to generate a current through the phase change material, and reading a parameter to determine a value of the unit cell.

Example embodiments of the present invention are also directed to a processing system including a non-volatile random access memory, such as a PRAM, including a plurality of Unit memory cells, where the non-volatile random access memory is directly connected to a central processing unit via an address bus and a control bus.

Example embodiments of the present invention are also directed to a method of fabricating a unit cell of a non-volatile memory including forming a MOS transistor on a substrate, forming a first insulator to insulate the MOS transistor, forming a first contact to access the MOS transistor, forming a first electrode, forming a phase change material on the first electrode, and forming a second electrode on the phase change material, wherein at least one of the phase change material and the second electrode is shared by adjacent unit cells of the non-volatile memory.

The unit cell may be part of an array of unit cells that make up a PRAM. The unit cells of the array may have common phase change material and/or common top electrodes. The commonality may extend to adjacent cells, and be in a block, row, or column.

BRIEF DESCRIPTION OF THE DRAWINGS

The present invention will become more fully understood from the detailed description given below and the accompanying drawings, which are given for purposes of illustration only, and thus do not limit the invention.

FIGS. 4a-4i illustrate a method of manufacturing unit cells of a PRAM in accordance with an example embodiment of the present invention.

FIGS. 12a-12b illustrate an example of the data storage or modification available with the various PRAM memories in accordance with example embodiments of the present invention.

It should be noted that these Figures are intended to illustrate the general characteristics of methods and devices of example embodiments of this invention, for the purpose of the description of such example embodiments herein. These drawings are not, however, to scale and may not precisely reflect the characteristics of any given embodiment, and should not be interpreted as defining or limiting the range of values or properties of example embodiments within the scope of this invention.

In particular, the relative thicknesses and positioning of layers or regions may be reduced or exaggerated for clarity. Further, a layer is considered as being formed "on" another layer or a substrate when formed either directly on the referenced layer or the substrate or formed on other layers or patterns overlaying the referenced layer.

DETAILED DESCRIPTION OF EXAMPLE EMBODIMENTS OF THE PRESENT INVENTION

Figure 1:
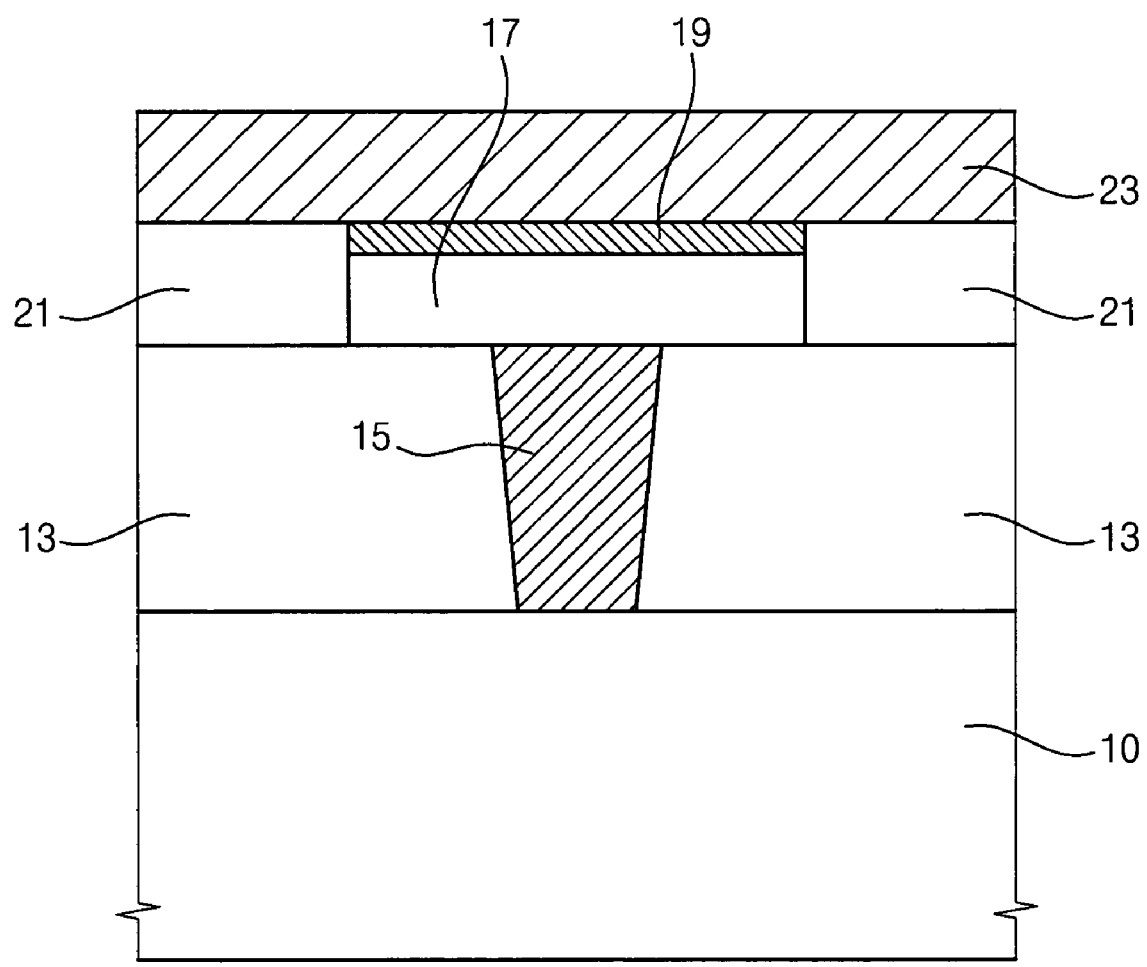
FIG. 1 illustrates a cross-sectional view of a conventional PRAM.
Figure 2:
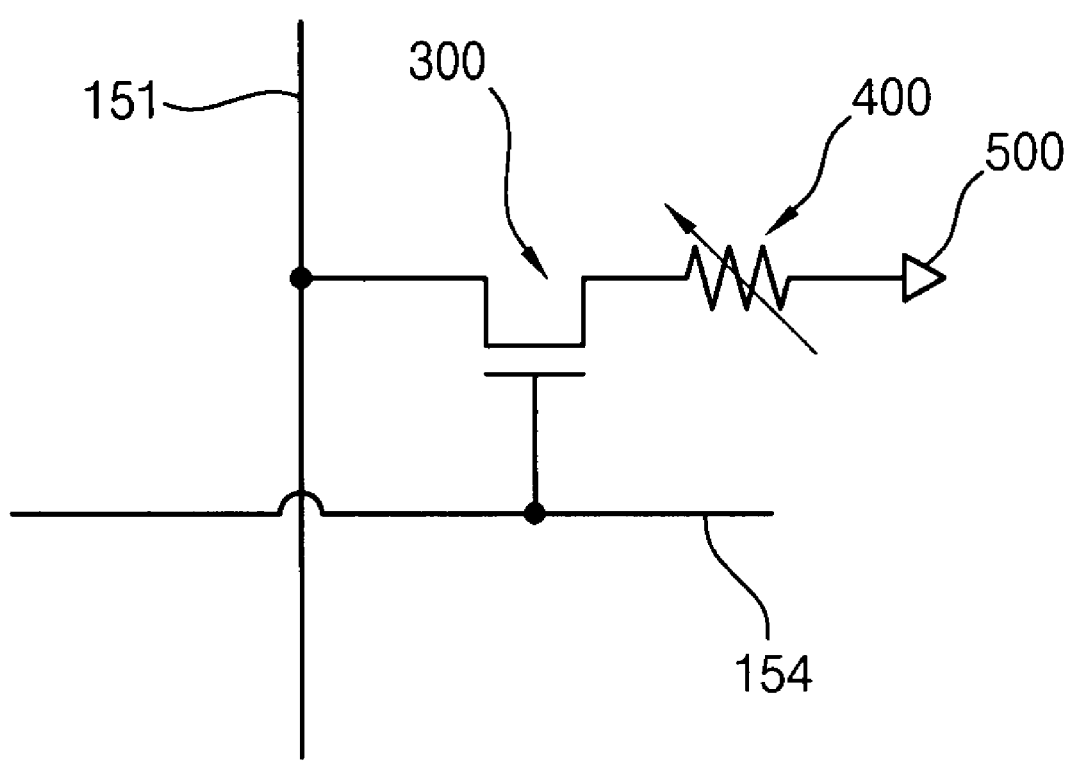
FIG. 2 is a circuit diagram of a unit cell of a phase changeable random access memory (PRAM) in accordance with an example embodiment of the present invention.

FIG. 2 is a circuit diagram of a unit cell of a phase changeable random access memory (PRAM) in accordance with an example embodiment of the present invention. As shown in FIG. 2, the unit cell may include a cell access transistor 300 (for example, a MOS transistor) and a phase changeable material (PCM) 400. A node of the PCM 400 may be connected to the plate electrode of a ground voltage 500.

The cell access transistor 300 may be connected to a word or address line 154 and a bit or data line 151 and receive a voltage from the data line 151. The voltage from the data line 151 creates a current through the PCM 400 to the ground voltage 500.

The cell access transistor 300 may be switched on or off by the word or address line 154. A programming signal may be supplied from the bit or data line 151 to the PCM 400 through the cell access transistor 300. The data stored in the PCM 400 is dependent on the magnitude of the power of programming signal supplied from the bit or data line 151 and its time duration. In an example embodiment, a cell plate can be common, for example, for a block unit, a row unit, or a column unit of cells, because its power need not change. In other example embodiments, power and/or ground may also be common for a block unit, a row unit, or a column unit of cells.

In an example embodiment, the programming signal may be shaped by setting a fall time so that the decaying or sloping trailing portion of the programming signal cools the phase change memory material at a rate sufficient to place the memory cell in a desired state of the multiple memory states. The fall time of the programming signal applied to a phase change material may be increased to reduce the resistance of the phase change material. Using this programming method, the resulting resistance of the phase change material need not be determined by the amplitude of the programming signal, but rather by the fall time of the programming signal.

In another example embodiment, an amplitude of the programming signal may be set to an amplitude sufficient to heat the phase change material of a memory cell to an amorphizing temperature and place the phase change material in a substantially amorphous state. To maintain the phase change material in the substantially amorphous state, the material may be rapidly cooled. This may be accomplished by having a relatively fast fall time for the applied programming signal.

Various plates, electrodes, PCMs, and/or other elements common to block units, row units, and/or column units are discussed in more detail below in conjunction with other example embodiments of the present invention.

In read mode, the word or address line 154 turns on the cell transistor 300 and the bit or data line 151 generates a reference voltage at the PCM 400. A sense amplifier may be used to detect the current of the bit or data line 151. If the current is high, this means that the PCM 400 is in a crystalline state having a lower resistance and if the current is low, this means that the PCM 400 is in an amorphous state having a higher resistance.

In an example embodiment, the unit cell of FIG. 2 can be read by turning on the cell access transistor 300 of the unit cell, supplying plate power to a top electrode of the unit cell, and supplying input power from the data line 151, through the cell access transistor 300, a bottom electrode, and a phase change material of the unit cell, to generate a current through the phase change material 400. A current or voltage may then be read to determine a value of the unit cell. In an example embodiment, the reading is performed by a sense amplifier. In an example embodiment, the sense amplifier compares the current to a reference current to determine a value of the unit cell. In an example embodiment, the current flows from the data line 151 to the top electrode.

In an example embodiment, a PRAM array includes a plurality of the unit cells shown in FIG. 2. The PRAM array may operate similar to an array of dynamic random access memory (DRAM) cells, where the capacitor of the DRAM is replaced by the PCM 400.

Figure 3:
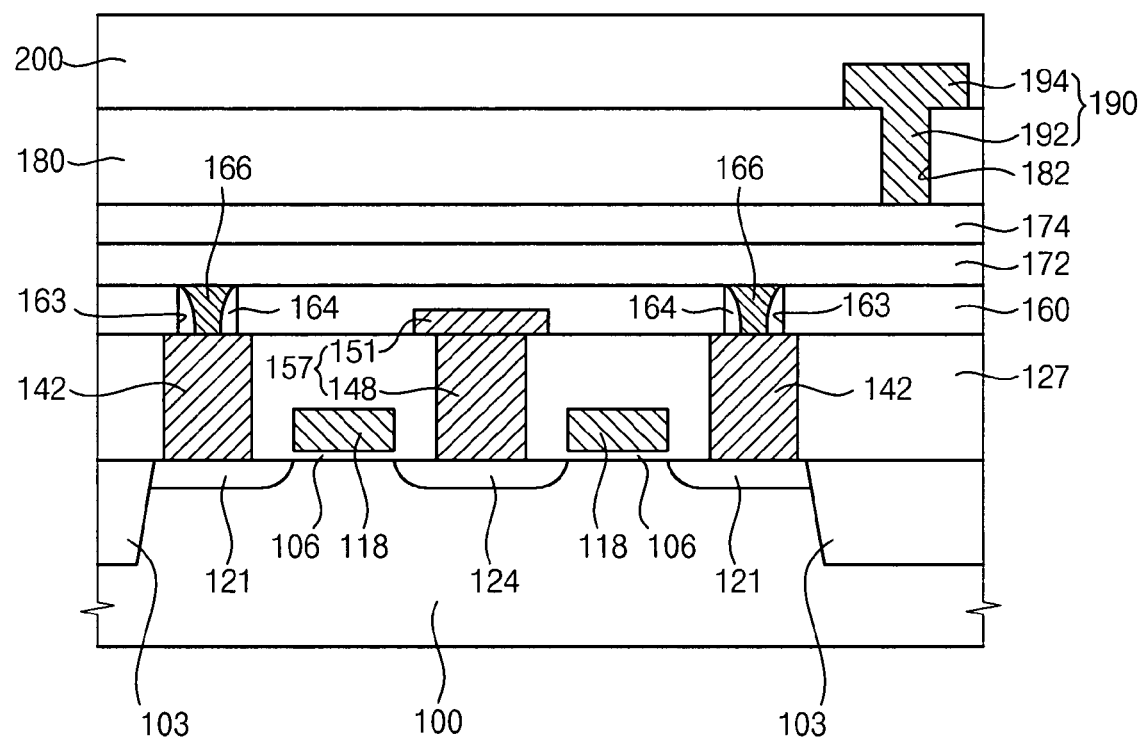
FIG. 3 illustrates a PRAM in accordance with an example embodiment of the present invention.

FIG. 3 illustrates a PRAM in accordance with an example embodiment of the present invention. As shown in FIG. 3, the PRAM includes a substrate 100, an isolation region 103, a bit line interconnection acting as a data line 157, a cell access transistor acting as an address line, a source of a cell access transistor 121, a drain of the cell access transistor 124, a bottom interconnection 142, a bottom electrode 166, contact spacers 163/164, a phase changeable material 172, a top electrode 174, and a top interconnection 190.

As shown in the example embodiment of FIG. 3, the data line 157 may be connected to the drain 124 of the cell access transistor 118. The source 121 of the cell access transistor 118 may be connected to the bottom electrode 166 via a bottom interconnection 142. Because the bottom electrode 166 should have a higher resistance to generate heat from a programming signal, the bottom electrode 166 may be formed smaller in size using the contact spacers 163/164. The generated heat affects the portion of the PCM 172 connected to the bottom electrode 166 to change its phase. The PCM 172 may be connected to the top electrode 174. The PCM 172 and/or the top electrode 174 need not be not separated between adjacent cells, namely, the PCM 172 and/or the top electrode 174 may be shared over at least two unit cells, for example, adjacent cells, arranged, for example, in a row, column, or block. The top electrode 174 may be biased toward a ground voltage via the top interconnection 190.

The resistance between the top electrode 174 and the bottom electrode 166 can be controlled by control of a magnitude and time period duration of a programming signal.

Figure 4A:
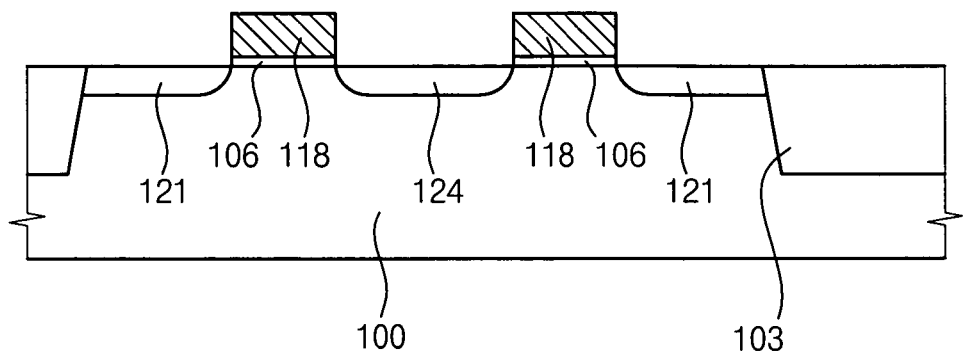

FIGS. 4a-4i illustrate a method of manufacturing unit cells of a PRAM in accordance with an example embodiment of the present invention. FIG. 4a illustrates a semiconductor substrate 100, an isolation region 103, gate insulators 106, and cell access transistors. Each cell access transistor may include a cell access transistor gate 118, a cell access transistor source 121, and a cell access transistor drain 124. The isolation region 103 and cell access transistors may be formed in the semiconductor substrate 100 by shallow trench isolation with separate active and field regions. In an example embodiment, the cell access transistors may be formed in a three-dimensional structure.

Figure 4B:
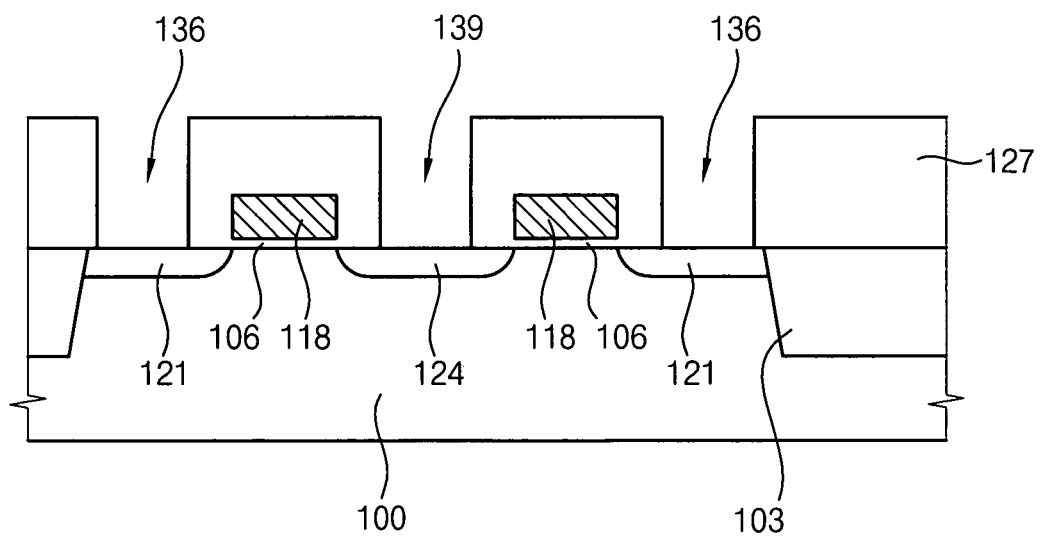
Figure 4C:
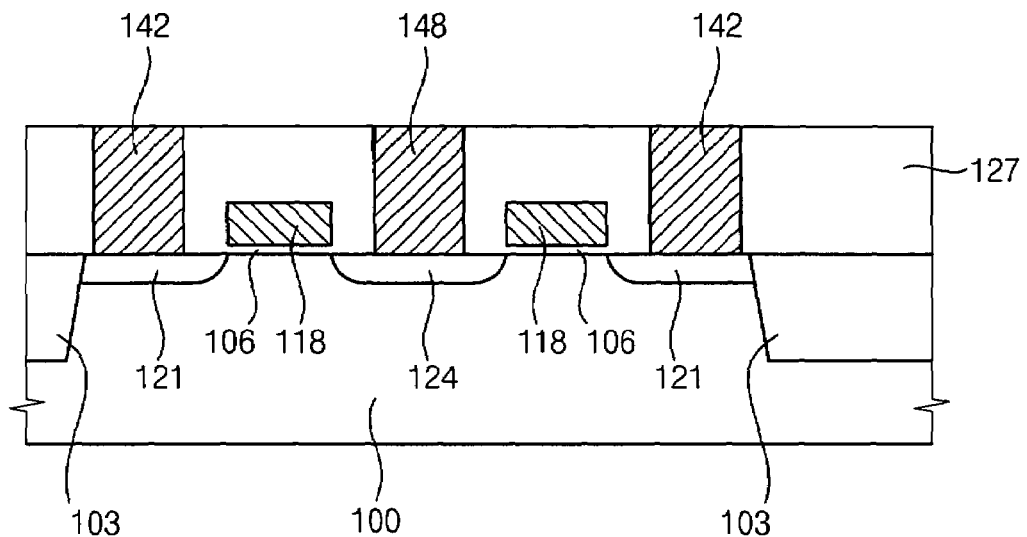

As show in FIG. 4b, a bottom insulation layer 127 may be formed. The bottom insulation layer 127 may include at least one of a silicon dioxide, tetraethyl orthosilicate (TEOS), undoped silicate glass (USG), spin on glass (SOG), and a high density plasma chemical vapor deposition (HDP-CVD) oxide compound. Contact holes 136, 139 may be formed on the source 121 and drain 124 regions, respectively, of each cell access transistor as shown in FIG. 4b and bottom interconnections 142 and data line interconnections 148 may be formed in the contact holes 136, 139, respectively, as shown in FIG. 4c.

Figure 4D:
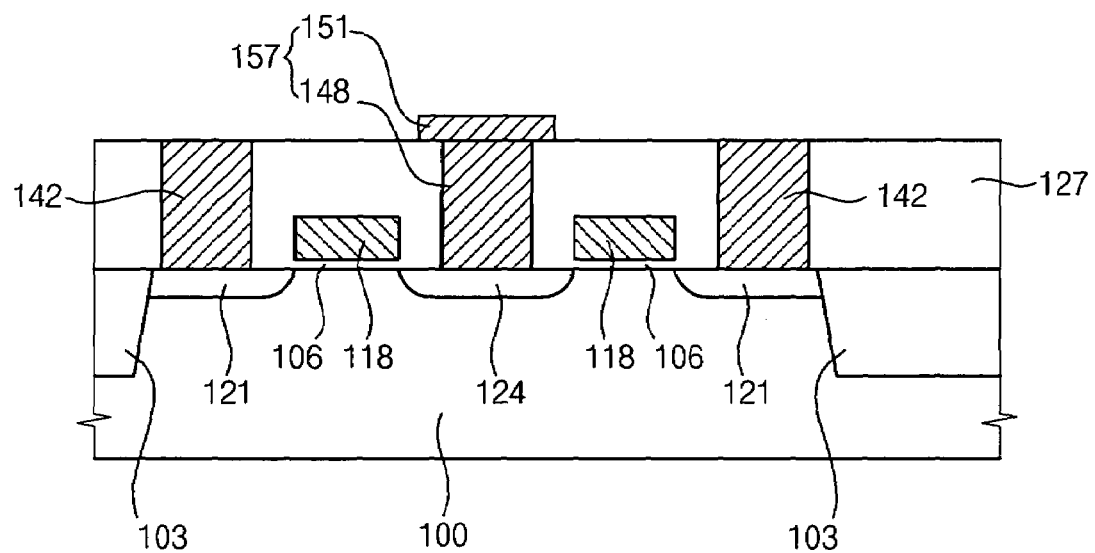
Figure 4E:
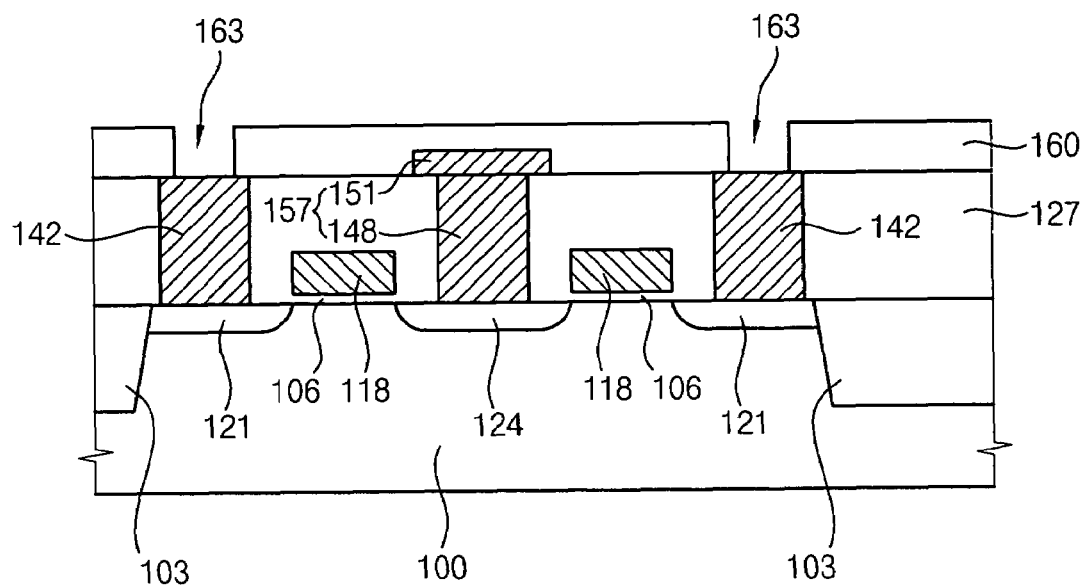

As show in FIG. 4d, a data line 151, 157 may be formed on the data line interconnection 148 and an intermediate insulation layer 160 may be formed on the data line 151, 157 and contact holes 163 may be formed in the intermediate insulation layer 160 above the bottom interconnections 142, as shown in FIG. 4e. The intermediate insulation layer 160 may include at least one of a silicon dioxide, tetraethyl orthosilicate (TEOS), undoped silicate glass (USG), spin on glass (SOG), and a high density plasma chemical vapor deposition (HDP-CVD) oxide compound.

Figure 4F:
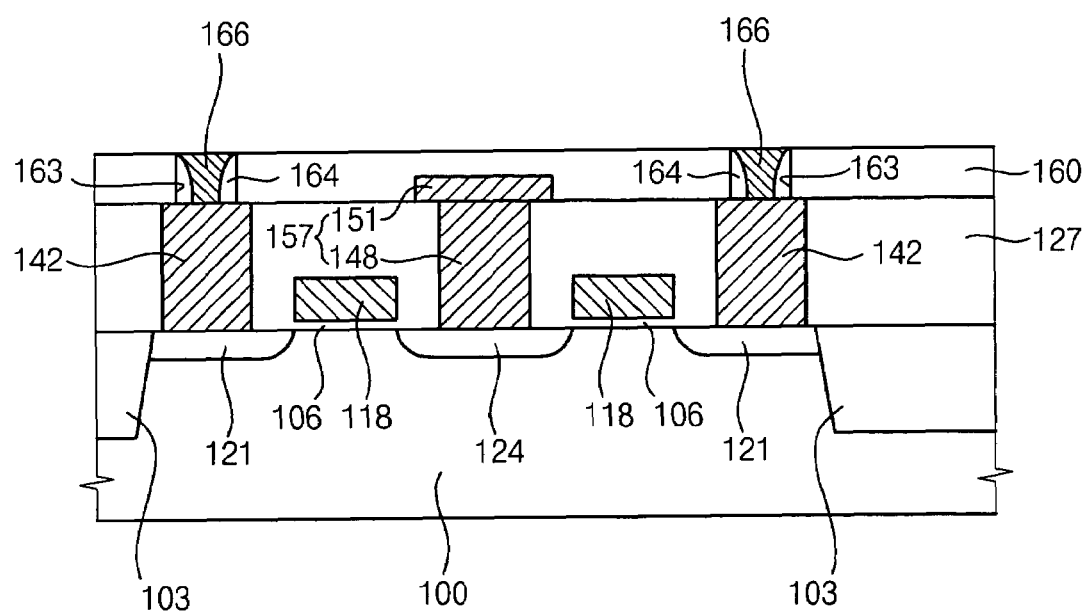

As show in FIG. 4f, contact spacers 164 may be formed on the sidewall of each contact hole 163 and a bottom electrode 166 may be formed in each contact hole 163. In an example embodiment, the bottom electrode 166 generates the heat to change the phase of the PCM 172.

Figure 4G:
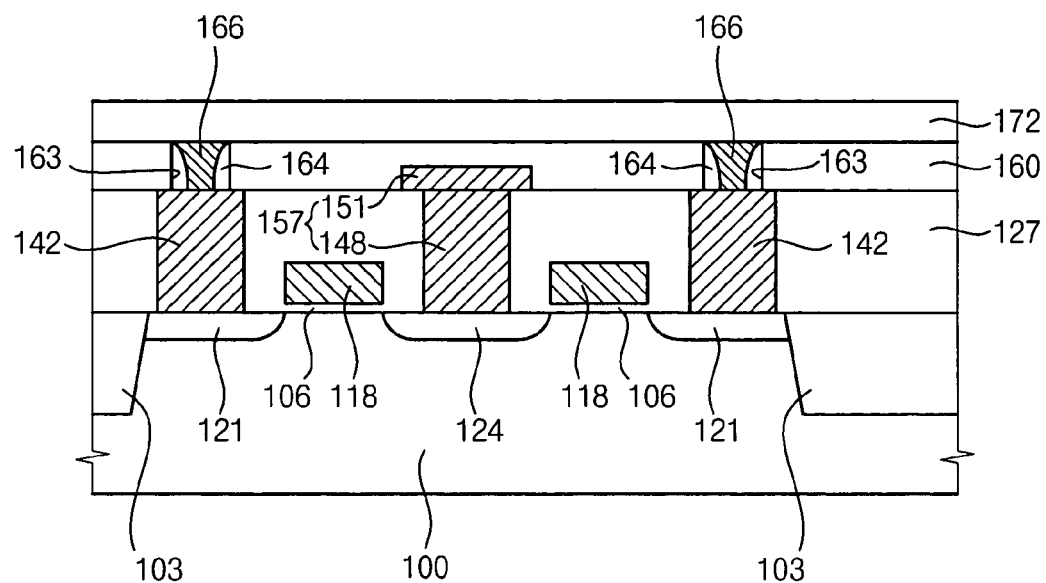

As show in FIG. 4g, the PCM 172 is formed on the intermediate insulation layer 160.

In an example embodiment such as the example embodiment of FIG. 3, the PCM 172 may have a thickness on the order of 10-100 nm, for example, 50 nm, the top electrode 174 may have a thickness on the order of 30 nm, and the bottom electrode 166/contact spacers 163/164 may have a thickness on the order of 70 nm.

In an example embodiment, the PCM 172 includes at least one chalcogenide.

In an example embodiment, the PCM 172 includes at least one binary, ternary, or quaternary phase change chalcogenide alloys.

In an example embodiment, binary phase change chalcogenide alloys may include one or more of Ga—Sb, In—Sb, In—Se, $Sb_2$—$Te_3$ or Ge—Te alloys; ternary phase change chalcogenide alloys may include one or more of Ge—Sb—Te, As—Sb—Te, Ta—Sb—Te, Nb—Sb—Te, V—Sb—Te, Ta—Sb—Te, Nb—Sb—Se, V—Sb—Se, W—Sb—Te, Mo—Sb—Te, Cr—Sb—Te, W—Sb—Se, Mo—Sb—Se, Cr—Sb—Se, or Sn—Sb—Te alloys; and quaternary phase-change chalcogenide alloys may include one or more of Sn—In—Sb—Te, As—Ge—Sb—Te, Ag—In—Sb—Te, (Ge—Sn)—Sb—Te, Ge—Sb—(Se—Te) or $Te_{81}$—$Ge_{15}$—$Sb_2$—$S_2$ alloys.

In an example embodiment, the PCM 172 includes at least one of sulfur (S), selenium (Se), and tellurium (Te).

In an example embodiment, the PCM 172 includes at least one of vanadium (V), niobium (Nb), and tantalum (Ta).

In an example embodiment, the PCM 172 includes at least one of chromium (Cr), molybdenum (Mo), and tungsten (W).

In an example embodiment, the PCM 172 includes germanium (Ge).

In an example embodiment, the PCM 172 includes antimony (Sb).

In an example embodiment, the PCM 172 is made of at least one Group VB element, including tantalum (Ta), niobium (Nb), and vanadium (V) and antimony-tellurium (Sb—Te), or at least one a Group VIB element including tungsten (W), molybdenum (Mo) and chromium (Cr) and antimony-selenium (Sb—Se).

In an example embodiment, the PCM 172 includes germanium-antimony-tellurium (GST). In an example embodiment, the PCM 172 further includes at least one impurity. In an example embodiment, the at least one impurity includes nitrogen.

Figure 4H:
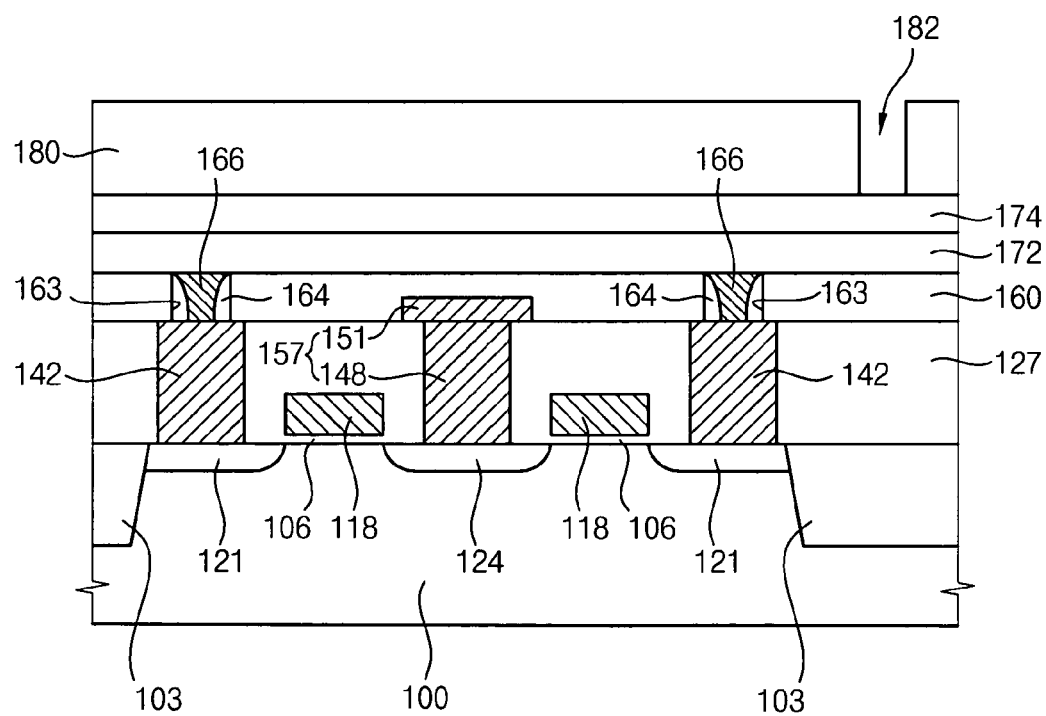
Figure 41:
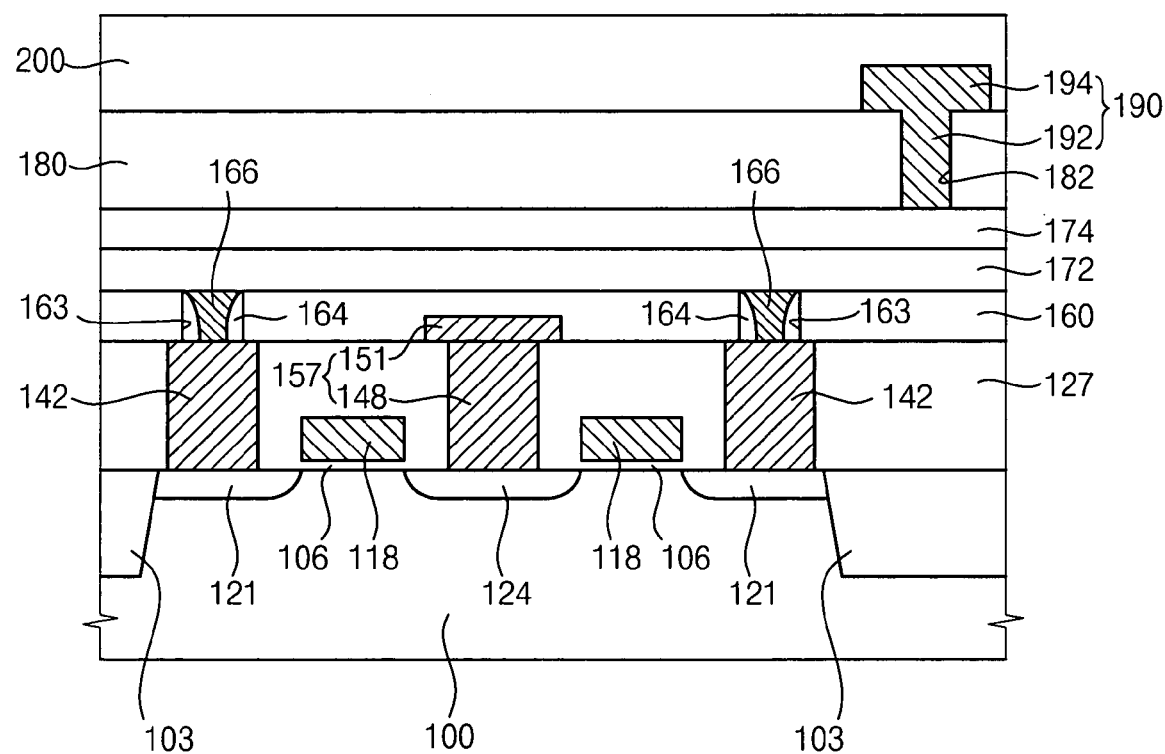

As show in FIG. 4h, a top electrode 174 may be formed on the PCM 172. In an example embodiment, the top electrode 174 may be formed by a chemical vapor deposition (CVD), physical vapor deposition (PVD) or atomic layer deposition (ALD) process. In an example embodiment, the top electrode 174 may be made of at least one of titanium (Ti), tantalum (Ta), molybdenum (Mo), niobium (Nb), zirconium (Zr), tungsten (W), a nitrogen-based conductive material, or a silicide.

In an example embodiment, the top electrode 174 may be made of titanium nitride (TiN), tantalum nitride (TaN), molybdenum nitride (MoN), niobium nitride, titanium silicon nitride, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, titanium oxynitride, titanium aluminum oxynitride, tungsten oxynitride, tantalum oxynitride, tantalum silicide (TaSi), tungsten silicide (WSi), or molybdenum silicide (MoSi).

In an example embodiment, the bottom electrode 166 may be made of titanium nitride (TiN), tantalum nitride (TaN), molybdenum nitride (MoN), niobium nitride, titanium silicon nitride, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, titanium oxynitride, titanium aluminum oxynitride, tungsten oxynitride, tantalum oxynitride, tantalum silicide (TaSi), tungsten silicide (WSi), or molybdenum silicide (MoSi).

In an example embodiment, the top electrode 174 may be patterned in a block unit, an array unit, a row unit, a column unit, or a cell unit.

As shown in FIG. 4h, another intermediate insulation layer 180 may be formed on the top electrode 174 and contact holes 182 may be formed in the intermediate insulation layer 180. A top interconnection 190 may be formed in the contact holes 182 and a passivation layer 200 may be formed on the top interconnection 190, as shown in FIG. 4i.

Figure 5A:
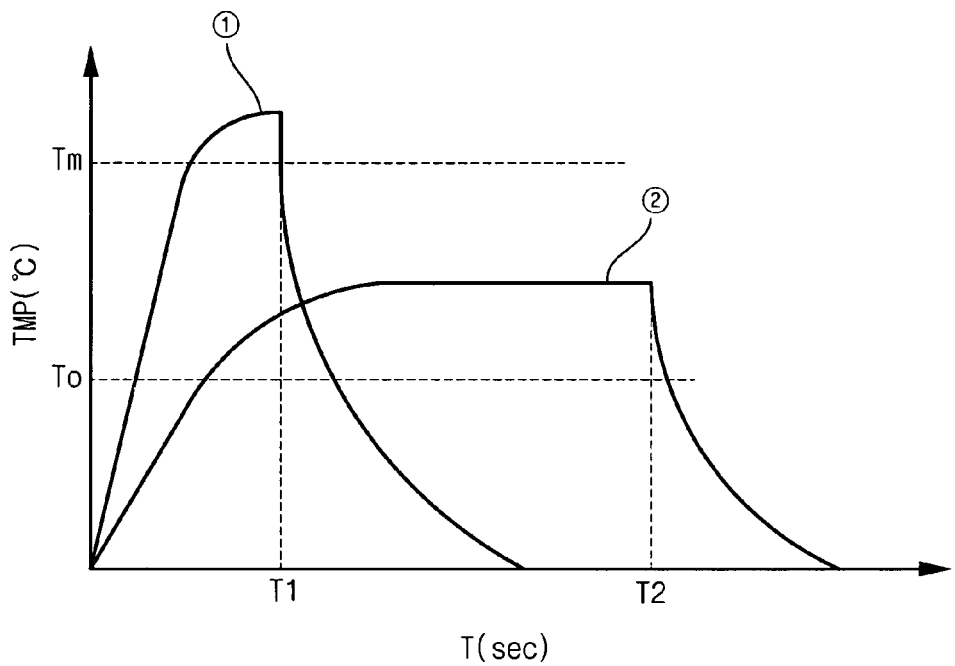
FIG. 5a illustrates a temperature versus time graph for heat applied to a PCM in accordance with an example embodiment of the present invention.
Figure 5B:
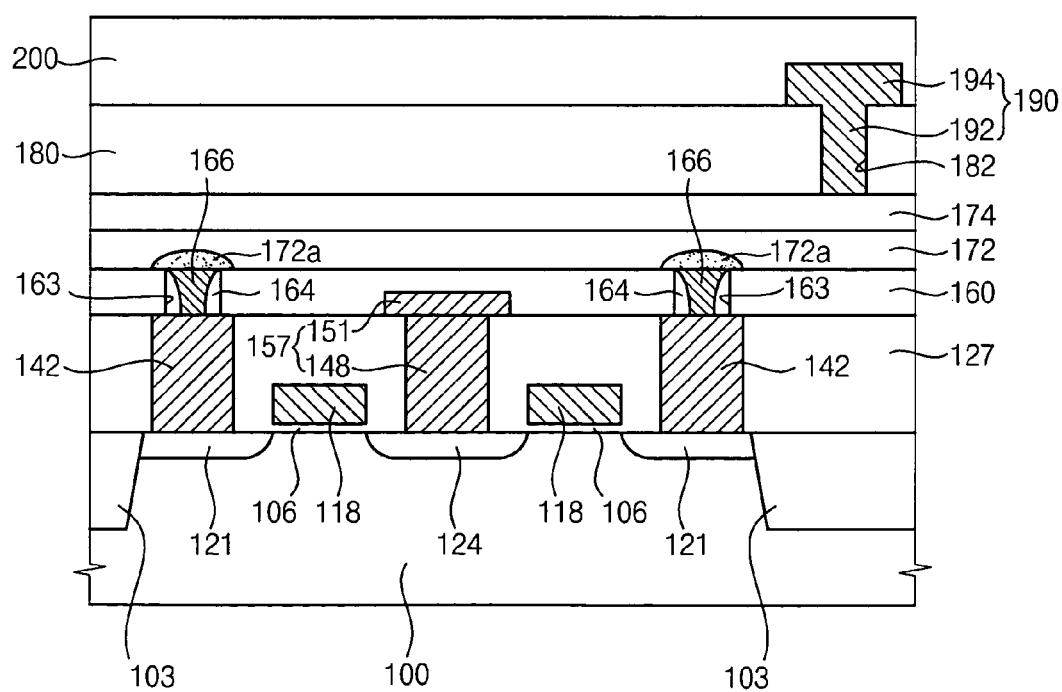
FIG. 5b illustrates a portion of a PCM that changes phase in accordance with an example embodiment of the present invention.

FIG. 5a illustrates a temperature versus time graph for heat applied to the PCM 172 in accordance with an example embodiment of the present invention. As shown in (1), if the PCM 172 is heated higher than a melting temperature $T_m$ (for example, 610° C.) of the PCM 172 for a first time period T1 and then cooled down more rapidly (for example, on the order of 1 nsec), the phase of a portion 172a of the PCM 172, shown in FIG. 5b, changes to an amorphous state. As shown in (2), if the PCM 172 is heated to a temperature between the melting temperature $T_m$ (for example, 610° C.) and the crystallization temperature $T_c$ (for example, 450° C.) of the PCM 172 and then cooled down more slowly (for example, on the order of 30 nsec), the phase of a portion of the PCM 172, shown in FIG. 5b, changes to a crystalline state. The resistance of the PCM 172 in the amorphous state may be on the order of 1000 Ωcm, the resistance of the PCM 172 in the crystalline state may be on the order of 0.01 Ωcm, and the difference in resistance of the PCM 172 between the amorphous state and the crystalline state of PCM may be on the order of 1000 times greater.

Figure 6A:
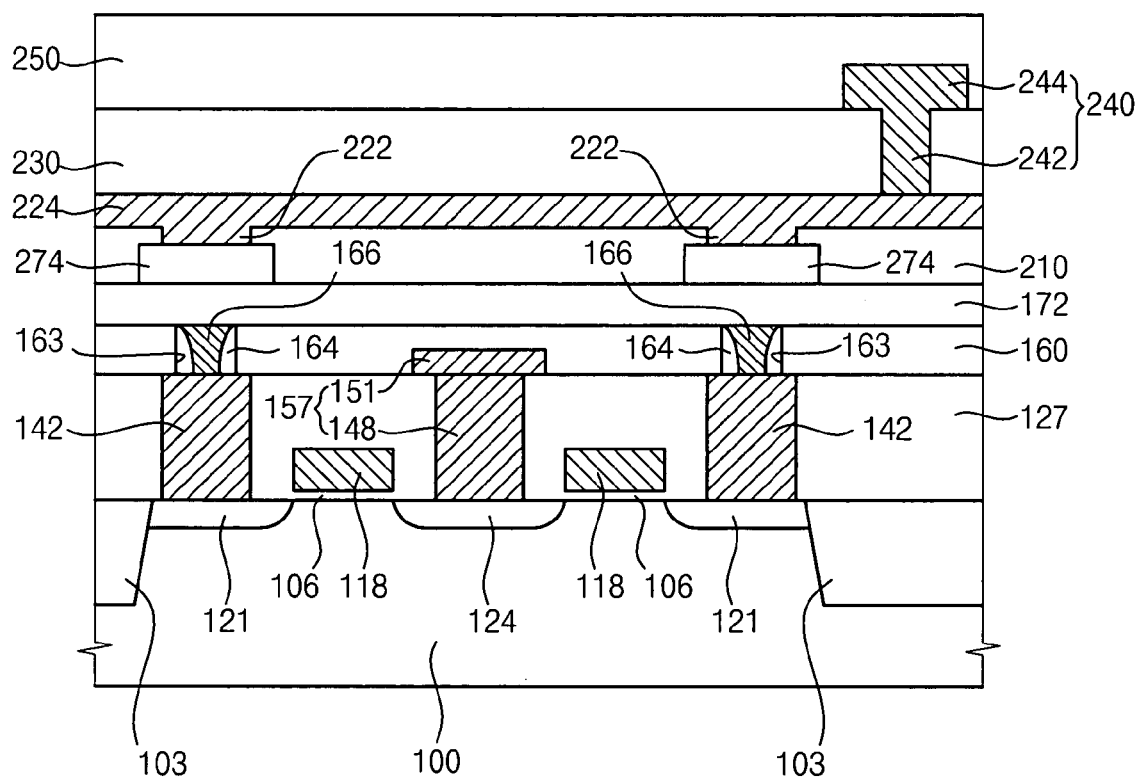
FIGS. 6a and 6b illustrate a PRAM in accordance with another example embodiment of the present invention.
Figure 6B:
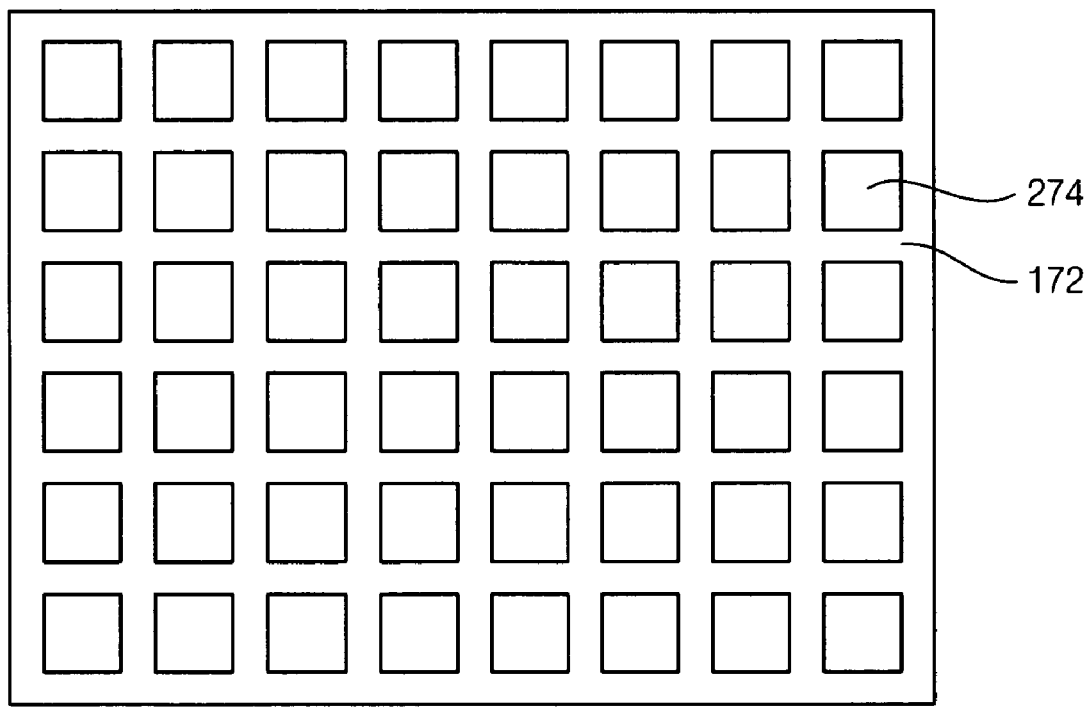

FIGS. 6a and 6b illustrate a PRAM in accordance with another example embodiment of the present invention. In contrast to the PRAM of FIG. 3, in the PRAM of FIGS. 6a and 6b, the top electrode 274 is also patterned (for example, by isolation type) to match the PCM 172 cell by cell. As also shown in FIG. 6a, another top interconnection layer 222, 224, another top insulation layer 230, another top interconnection layer 240 and/or another top passivation layer 250 may be formed on the top electrode 274.

Figure 7A:
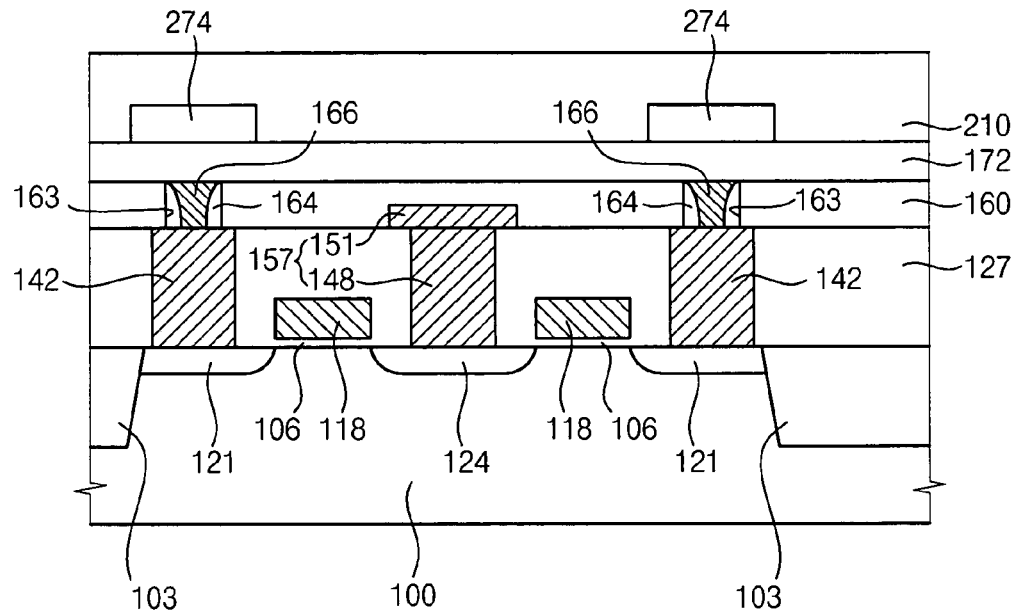
FIGS. 7a-7c illustrate a method of manufacturing unit cells of a PRAM in accordance with another example embodiment of the present invention.
Figure 7B:
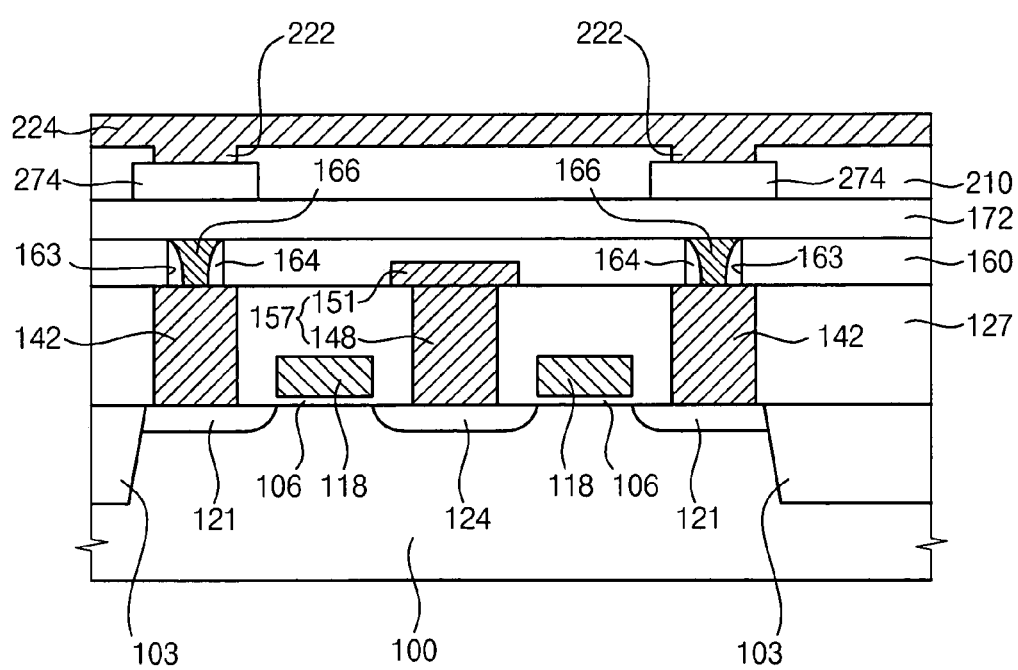
Figure 7C:
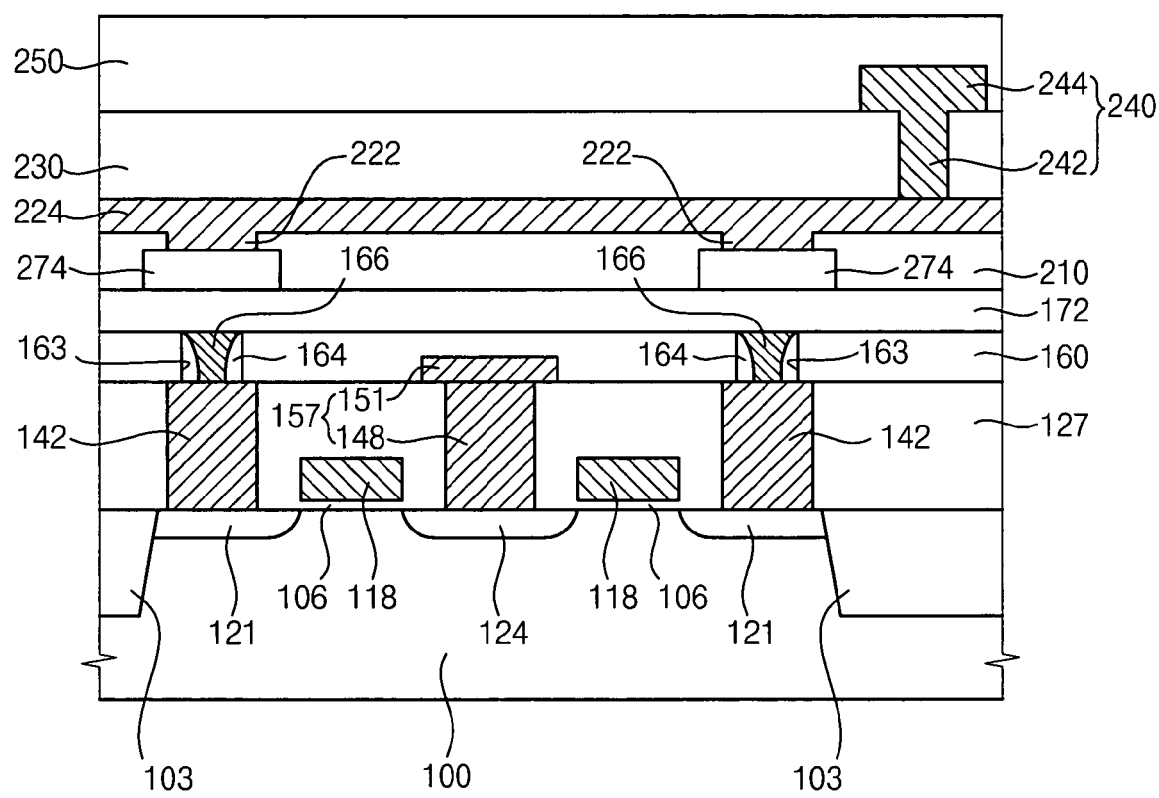

FIGS. 7a-7c illustrate a method of manufacturing unit cells of a PRAM in accordance with another example embodiment of the present invention. The method of FIGS. 7a-7c may be substantially the same as the method of FIGS. 4a-4i with one or more of the following variations. Although the PCM 172 may be formed in the same manner as in FIG. 4g, the top electrode 274 may be patterned to communicate with each cell, as shown in FIG. 7a.

As shown in FIG. 7b, a third interconnection layer 210 may be formed on the PCM 172, via holes 222 may be formed in the third interconnection layer 210 and a top interconnection 222, 224 may be formed and patterned.

As shown in FIG. 7c, a top insulation layer 230 may be formed on the top interconnection 222, 224, via holes 242 may be formed in the top insulation layer 230, the top interconnection 240 may be formed and patterned, and a passivation layer 250 may be formed on the top insulation layer 230. The example embodiment of FIGS. 6 and 7a-7c may allow easier patterning of the PCM 172 and/or separate communication between the bottom electrode 166 and the top electrode 274.

Figure 8A:
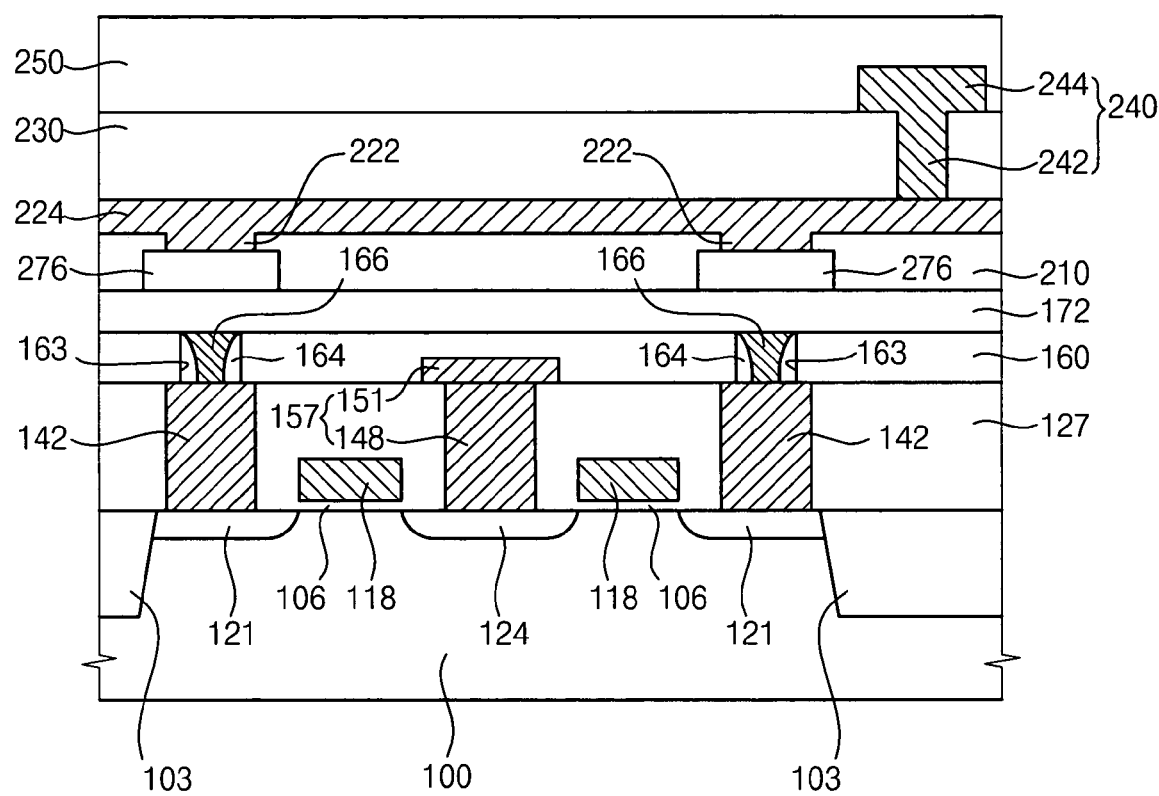
FIGS. 8a-8b illustrate a PRAM in accordance with another example embodiment of the present invention.
Figure 8B:
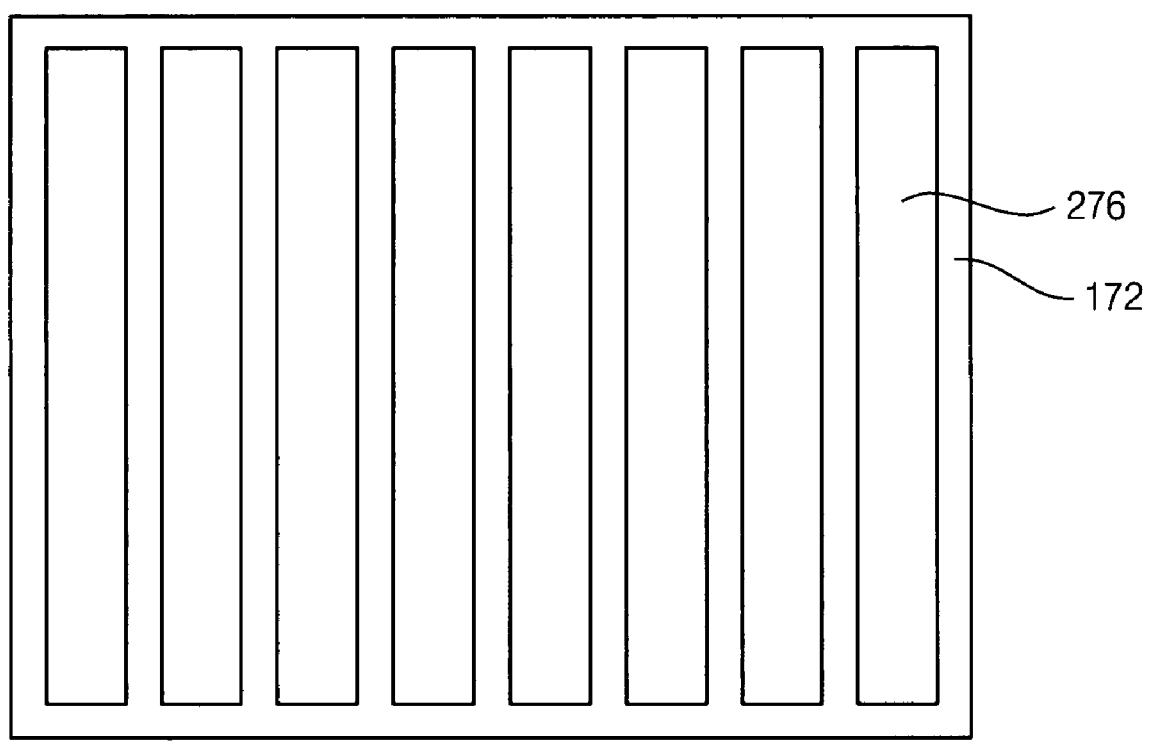

FIGS. 8a-8b illustrate a PRAM in accordance with another example embodiment of the present invention. In the PRAM of FIGS. 8a-8b, the top electrode 276 has a line pattern, which covers multiple cells. FIG. 8b illustrates the relationship between the PCM 172 and the top electrode 276 in more detail. The example embodiment of FIGS. 8a and 8b may allow easier patterning of the PCM 172 and the top electrode 276.

Figure 9A:
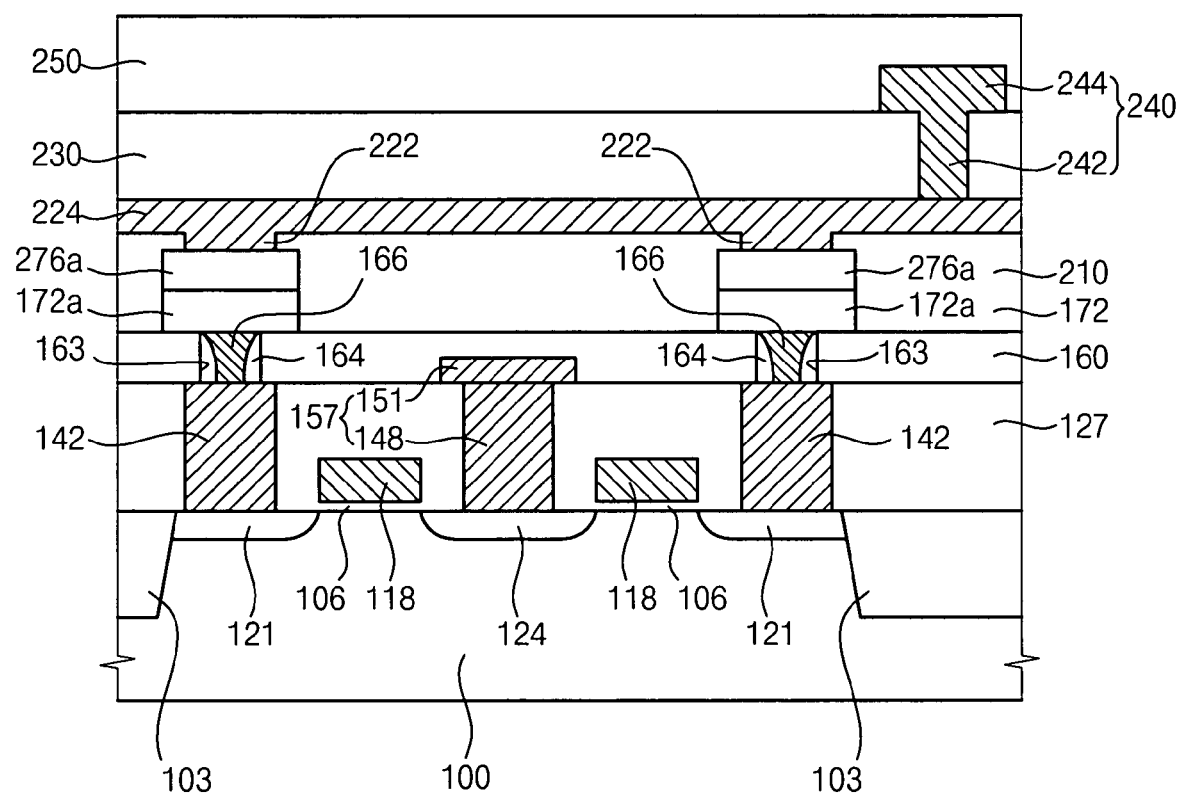
FIGS. 9a-9b illustrate a PRAM in accordance with another example embodiment of the present invention.
Figure 9B:
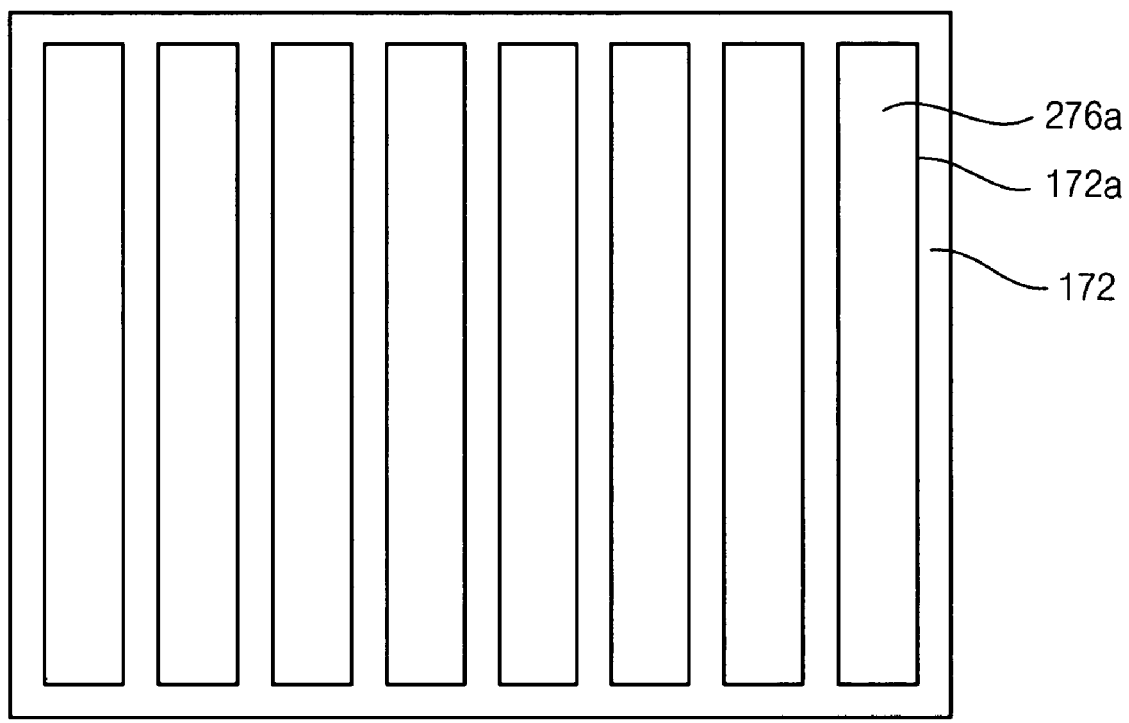

FIGS. 9a-9b illustrate a PRAM in accordance with another example embodiment of the present invention. In the PRAM of FIGS. 9a-9b, the PCM 172a and the top electrode 276a have the same line pattern. FIG. 9b illustrates the relationship between the PCM 172a and the top electrode 276a in more detail.

In an example embodiment such as the example embodiment of FIGS. 9a-9b, the PCM 172a and the top electrode 276a may have a length on the order of 200 nm and a width on the order of 100 nm.

Figure 10A:
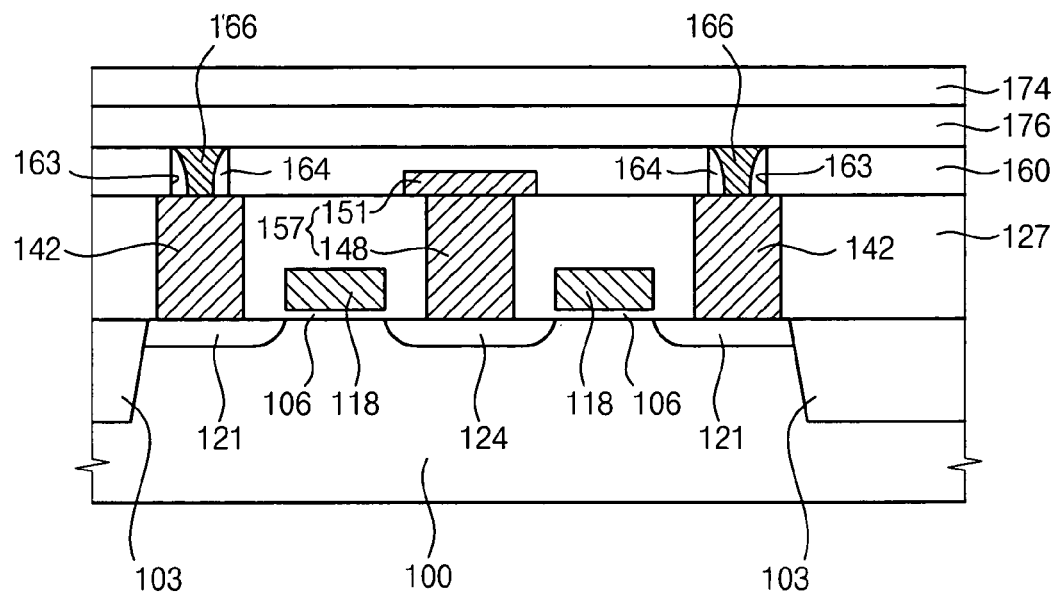
FIGS. 10a-10b illustrate a method of manufacturing unit cells of a PRAM in accordance with another example embodiment of the present invention.
Figure 10B:
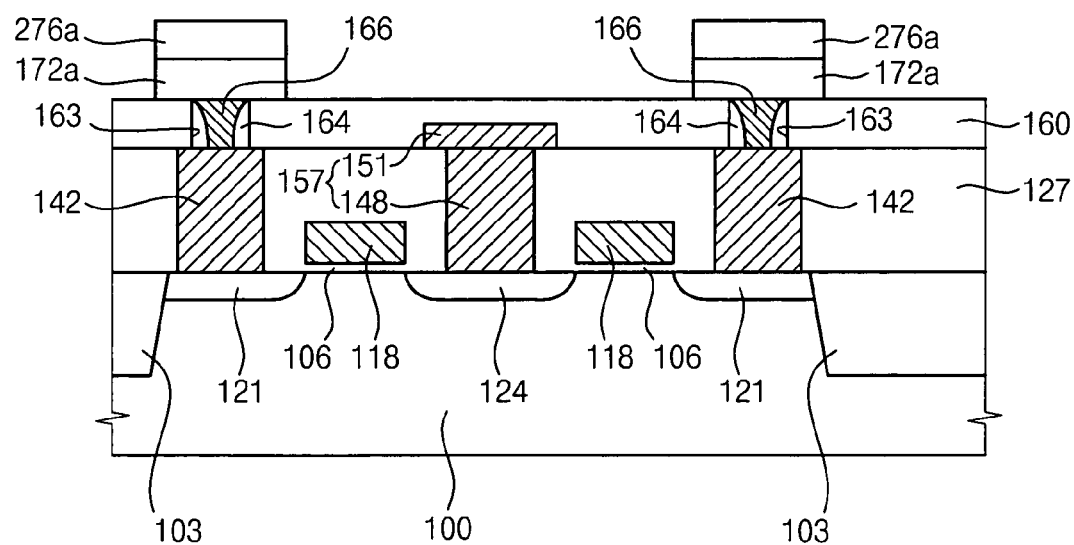

FIGS. 10a-10b illustrate a method of manufacturing unit cells of a PRAM in accordance with another example embodiment of the present invention. The method of FIGS. 10a-10b may be substantially the same as the method of FIGS. 4a-4i and/or FIGS. 7a-7c with one or more of the following variations. For example, the same processing may be used as shown in FIG. 10a up until the formation of the tope electrode 176, the PCM 172a and the top electrode 276a may be patterned simultaneously, as shown in FIG. 10b.

The example embodiments of PRAMs discussed above may be considered non-volatile memories. The example embodiments of PRAMs discussed above and their method of manufacture have a number of useful applications. Some examples of these applications are described in conjunction with FIGS. 11-15.

Figure 11A:
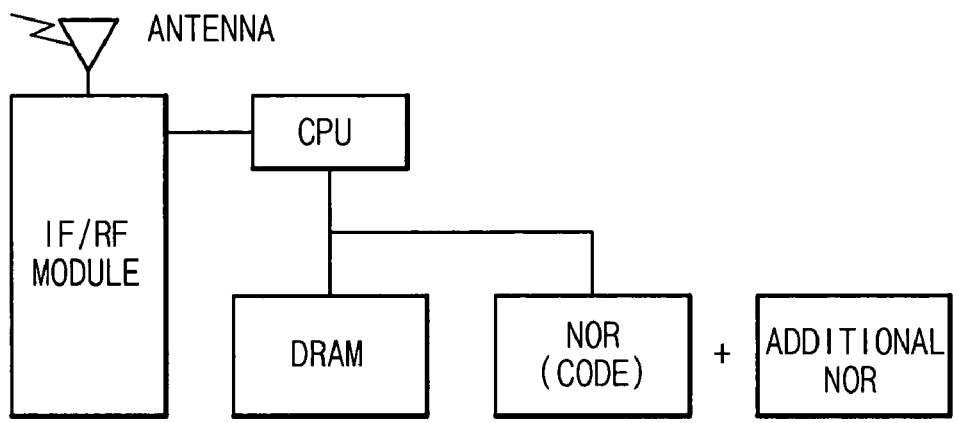
FIGS. 11a-11b illustrate an example of the data and code region flexibility available with the various PRAM memories in accordance with example embodiments of the present invention.
Figure 11B:
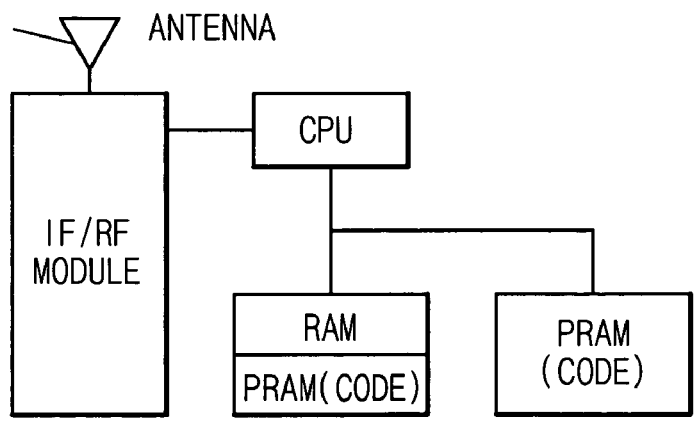

FIGS. 11a-11b illustrate an example of the data and code region flexibility available with the various PRAM memories in accordance with example embodiments of the present invention. As shown in FIG. 11a, in conventional memory solutions, an antenna-IF/RF module-CPU arrangement is provide with DRAM memory and internal NOR memory. If the internal NOR memory is exceeded, external NOR memory is added.

In contrast, as shown in FIG. 11b, a portion (or all) of the DRAM and the internal NOR memory may be replaced with RAM and one of the various PRAM memories in accordance with example embodiments of the present invention, thereby rendering additional external NOR memory unnecessary.

Figure 12B:
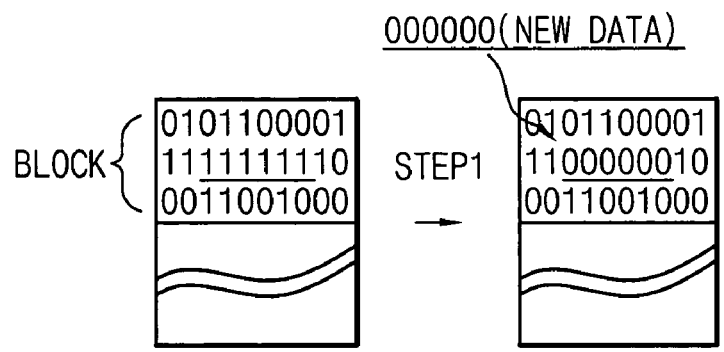

FIGS. 12a-12b illustrate an example of the data storage or modification available with the various PRAM memories in accordance with example embodiments of the present invention. As shown in FIG. 12a, conventional memory solutions utilize Flash memory and DRAM performing a block unit operation to write data. As shown in FIG. 12a, changing data in the Flash memory is a four step operation. First, the original data (for example, 111111) to be changed is written to the DRAM. Second, the new data (for example, 000000) is written in the DRAM. Third, the block of the Flash memory is erased. Fourth, the new data (for example, 000000) is written in the Flash memory. These four steps make take on the order of 1 second.

In contrast, as shown in FIG. 12b, the Flash memory and the DRAM may be replaced with one of the various PRAM memories in accordance with example embodiments of the present invention, and the new data (for example, 000000) may be written to replace the original data (for example, 111111) in one operation. This single operation may take on the order of 70 nsec.

Figure 13A:
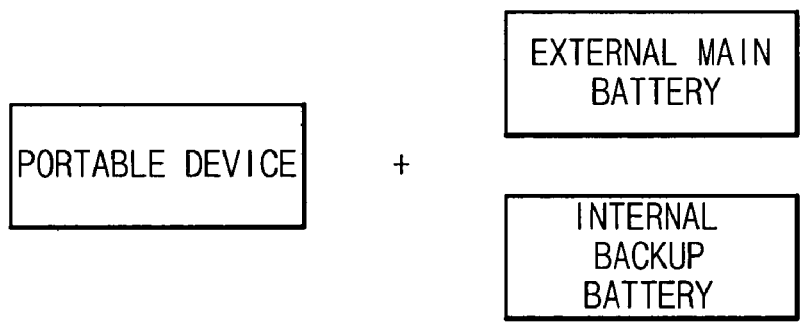
FIGS. 13a-13b illustrate an example of alleviating the need for an internal backup battery, by using the various PRAM memories in accordance with example embodiments of the present invention.
Figure 13B:

FIGS. 13a-13b illustrate an example of alleviating the need for an internal backup battery for portable devices, by using the various PRAM memories in accordance with example embodiments of the present invention. As shown in FIG. 13a, conventional memory solutions for portable devices include an external main battery and an internal backup battery. The internal backup battery is necessary to sustain data in DRAM of the portable device when the external main battery is being exchanged.

In contrast, as shown in FIG. 13b, the DRAM may be replaced with one of the various PRAM memories in accordance with example embodiments of the present invention and the internal backup battery is no longer needed.

Figure 14A:
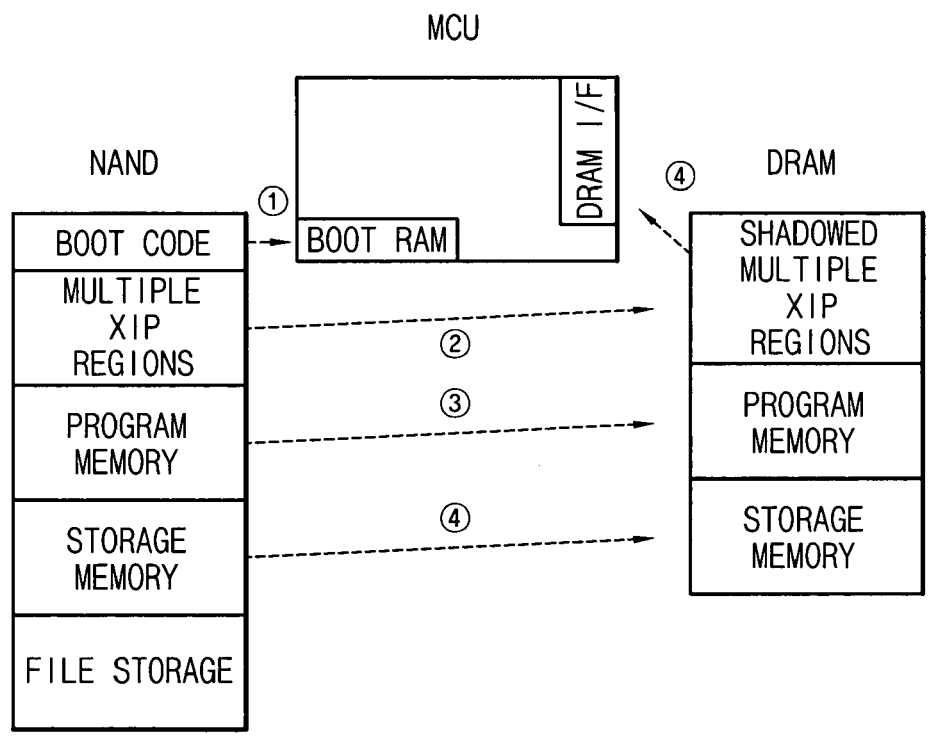
FIGS. 14a-14b illustrate an example of decreasing boot time and reducing memory cost, by using the various PRAM memories in accordance with example embodiments of the present invention.
Figure 14B:
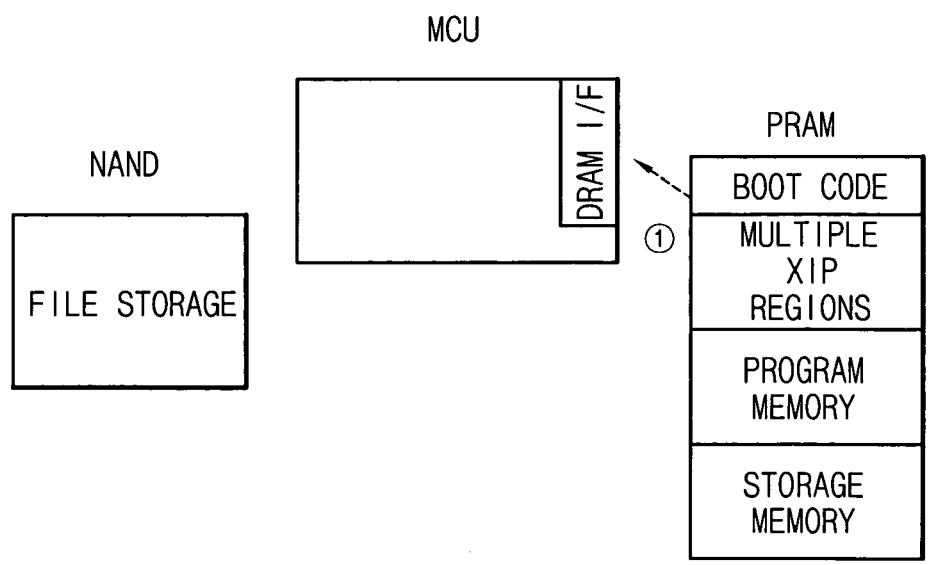

FIGS. 14a-14b illustrate an example of decreasing boot time and reducing memory cost, by using the various PRAM memories in accordance with example embodiments of the present invention.

As shown in FIG. 14a, conventional memory solutions include an MCU, NAND memory which interfaces with Boot RAM of the MCU, and DRAM memory, which interfaces with a DRAM interface of the MCU. In conventional memory solutions, booting is a four step process. First, instructions are loaded from the boot code of the NAND memory to the Boot RAM of the MCU. Second, instructions are loaded from the multiple XIP regions of the NAND memory to the shadowed multiple XIP regions of the DRAM memory. Third, instructions are loaded from the program memory of the NAND memory to the program memory of the DRAM memory. Finally, data is loaded from the storage memory of the NAND memory to the storage memory of the DRAM memory and the shadowed multiple XIP regions of the DRAM memory are loaded into the DRAM interface of the MCU.

In contrast, as shown in FIG. 14b, the boot code may be stored in a PRAM memory in accordance with example embodiments of the present invention and directly loaded from the PRAM into the DRAM interface of the MCU in one operation. Additionally, the amount of NAND memory required may be reduced or the entire NAND memory may used for file storage, instead of other instructions and/or data (for example, boot code, multiple XIP regions, program memory, and/or storage memory).

Figure 15A:
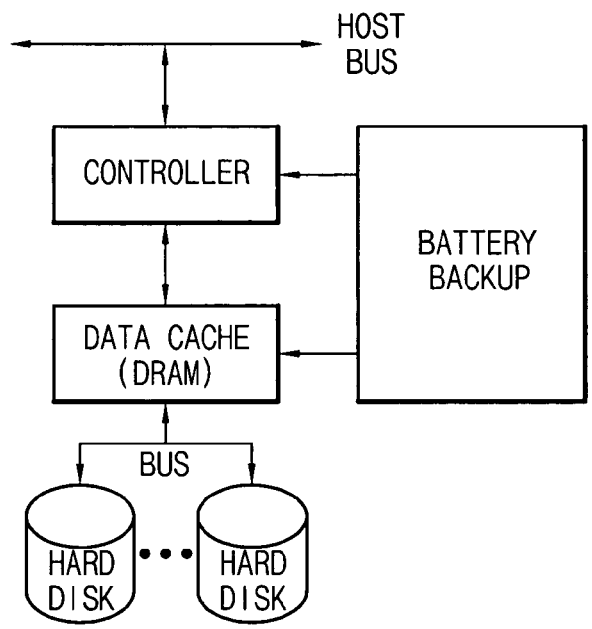
FIGS. 15a and 15b illustrate another example of alleviating the need for a backup battery, by using the various PRAM memories in accordance with example embodiments of the present invention.
Figure 15B:
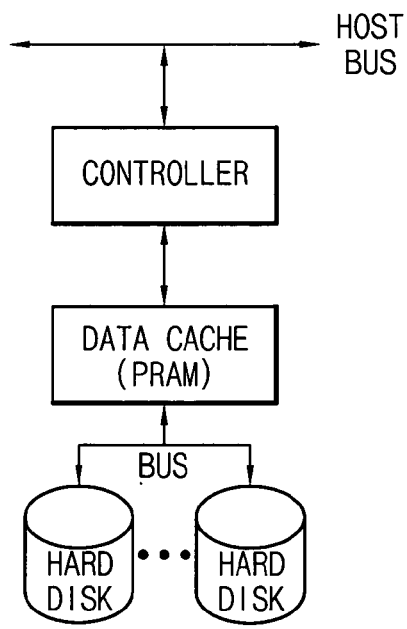

FIGS. 15a and 15b illustrate another example of alleviating the need for a backup battery, in this instance, for a redundant array of inexpensive disks (RAID), by using the various PRAM memories in accordance with example embodiments of the present invention. As shown in FIG. 15a, conventional RAID controllers include a DRAM data cache, a plurality of hard disks, and a battery backup.

In contrast, as shown in FIG. 15b, the DRAM may be replaced with one of the various PRAM memories in accordance with example embodiments of the present invention and the battery backup is no longer needed.

As described above, the present invention is directed to various embodiments of PRAM memories, operated and/or fabricated in various ways, to achieve a wide variety of advantages.

In addition to the example set forth above, the various PRAM memories in accordance with example embodiments of the present invention may be used in a variety of electronic systems including portable applications, such as, for example, portable communication devices (e.g., a mobile cell phone), two-way radio communication devices, one-way pagers, two-way pagers, personal communication systems (PCS), portable computers, personal digital assistants (PDA), and/or other similar devices and nonportable electronic applications, such as for example, cellular base stations, servers, desktop computers, video equipment, and/or other similar devices.

Although the scope of the present invention is not limited in this respect, the example embodiments of PRAM discussed above may be memory arrays comprising a plurality of memory cells that may include a phase change memory material such as, for example, a chalcogenide material that may be programmed into different memory states to store data. This material may be, for example, a chalcogenide alloy that exhibits a reversible structural phase change from an amorphous state to a crystalline or a polycrystalline state. Due to the reversible structure, the phase change material may change from the amorphous state to the crystalline state and may revert back to the amorphous state thereafter, or vice versa, in response to temperature changes.

Example embodiments of PRAM discussed above may be used as binary cells (amorphous or crystalline) or multilevel cells (for example, amorphous, substantially amorphous, crystalline, and substantially crystalline).

It will be apparent to those skilled in the art that other changes and modifications may be made in the above-described example embodiments without departing from the scope of the invention herein, and it is intended that all matter contained in the above description shall be interpreted in an illustrative and not a limiting sense.

We claim:

1. A unit cell of a non-volatile memory, comprising:
   a MOS transistor, connected to an address line and a data line, said MOS transistor receiving a voltage from the data line;
   a phase change material for changing phase depending on heat generated by the voltage, the phase change material being shared by other unit cells of the non-volatile memory; and
   a top electrode, connected to a substantially ground voltage.

2. The unit cell of claim 1, wherein the top electrode is shared by other unit cells of the non-volatile memory.

3. The unit cell of claim 2, wherein at least one of the phase change material and the top electrode are shared by adjacent unit cells of the non-volatile memory.

4. The unit cell of claim 2, wherein the top electrode for each unit cell of the non-volatile memory is patterned cell by cell.

5. The unit cell of claim 2, wherein the top electrode is shared by each unit cell in a row of a block of the non-volatile memory.

6. The unit cell of claim 2, wherein the top electrode is shared by each unit cell in a column of a block of the non-volatile memory.

7. The unit cell of claim 2, wherein the phase change material and the top electrode are shared by other unit cells of a block of the non-volatile memory.

8. The unit cell of claim 7, wherein the phase change material and the top electrode are shared by adjacent unit cells of a block of the non-volatile memory.

9. The unit cell of claim 1, wherein the phase change material includes at least one of sulfur (S), selenium (Se), and tellurium (Te).

10. The unit cell of claim 1, wherein the phase change material includes at least one chalcogenide.

11. The unit cell of claim 1, wherein the phase change material is made of at least one Group VB element, including tantalum (Ta), niobium (Nb), and vanadium (V) and antimony-tellurium (Sb—Te), or at least one a Group VIB element including tungsten (W), molybdenum (Mo) and chromium (Cr) and antimony-selenium (Sb—Se).

12. The unit cell of claim 1, wherein the phase change material includes germanium-antimony-tellurium (GST).

13. The unit cell of claim 12, wherein the phase change material further includes at least one impurity.

14. The unit cell of claim 13, wherein the at least one impurity includes nitrogen.

15. The unit cell of claim 1, wherein the phase change material has a thickness of 10-100 nm.

16. The unit cell of claim 1, wherein the top electrode is made of at least one of titanium (Ti), tantalum (Ta), molybdenum (Mo), niobium (Nb), zirconium (Zr), tungsten (W), a nitrogen-based conductive material, or a silicide.

17. The unit cell of claim 16, wherein the top electrode is made of titanium nitride(TiN), tantalum nitride(TaN), molybdenum nitride(MoN), niobium nitride, titanium silicon nitride, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, titanium oxynitride, titanium aluminum oxynitride, tungsten oxynitride, tantalum oxynitride, tantalum silicide (TaSi), tungsten silicide (WSi), or molybdenum silicide (MoSi).

18. The unit cell of claim 1, further comprising:
a bottom electrode, formed between the MOS transistor and the phase change material.

19. The unit cell of claim 18, wherein the bottom electrode generates the heat to change the phase of the phase change material.

20. The unit cell of claim 1, further comprising:
a first insulating layer, formed between the MOS transistor and the phase change material.

21. The unit cell of claim 20, wherein the first insulating layer includes at least one of a silicon dioxide, tetraethyl orthosilicate (TEOS), undoped silicate glass (USG), spin on glass (SOG), and a high density plasma chemical vapor deposition (HDP-CVD) oxide compound.

22. The unit cell of claim 20, further comprising:
a second insulating layer, formed between the MOS transistor and the phase change material.

23. The unit cell of claim 22, wherein the second insulating layer includes at least one of a silicon dioxide, tetraethyl orthosilicate (TEOS), undoped silicate glass (USG), spin on glass (SOG), and a high density plasma chemical vapor deposition (HDP-CVD) oxide compound.

24. A unit cell of a non-volatile memory, comprising:
a MOS transistor, connected to an address line and a data line, said MOS transistor receiving a voltage from the data line;
a phase change material for changing phase depending on heat generated by the voltage; and
a top electrode, connected to a substantially ground voltage; wherein
at least one of the phase change material and the top electrode are shared by other unit cells of the non-volatile memory, and
the top electrode for each unit cell of the non-volatile memory is patterned cell by cell.

* * * * *